United States Patent [19]

McCollum et al.

[11] Patent Number: 5,132,571
[45] Date of Patent: Jul. 21, 1992

[54] PROGRAMMABLE INTERCONNECT ARCHITECTURE HAVING INTERCONNECTS DISPOSED ABOVE FUNCTION MODULES

[75] Inventors: John L. McCollum, Saratoga; Abbas A. El Gamal; Jonathan W. Greene, both of Palo Alto, all of Calif.

[73] Assignee: Actel Corporation, Sunnyvale, Calif.

[21] Appl. No.: 561,110

[22] Filed: Aug. 1, 1990

[51] Int. Cl.[5] .......................................... H03K 19/177
[52] U.S. Cl. .............................. 307/465.1; 307/468; 307/303.2; 357/45
[58] Field of Search ...................... 307/465, 468, 465.1, 307/469, 303.1, 303.2; 357/45

[56] References Cited

U.S. PATENT DOCUMENTS

| | | | |
|---|---|---|---|
| 4,642,487 | 2/1987 | Carter | 307/465.1 X |
| 4,758,745 | 7/1988 | El Gamal et al. | 307/465 |
| 4,786,904 | 11/1988 | Graham, III et al. | 307/465 X |
| 4,868,426 | 9/1989 | Brockmann | 307/468 X |
| 4,933,576 | 6/1990 | Tamamuwa et al. | 307/303.1 X |
| 4,963,768 | 10/1990 | Agrawal et al. | 307/465 |
| 4,984,050 | 1/1991 | Kobayashi | 357/45 X |

FOREIGN PATENT DOCUMENTS

0144956 7/1985 Japan ..................................... 357/45

OTHER PUBLICATIONS

Kurzberg & Yotta, "Channel Assignment for Chip Wiring", *IBM T.D.B.*, vol. 26, No. 3A, Aug. 1983, pp. 934-936.

Freeman, "User—programmable gate arrays", *IEEE Spectrum*, Dec. 1988, pp. 32-35.

*Primary Examiner*—David Hudspeth
*Attorney, Agent, or Firm*—Kenneth D'Alessandro

[57] ABSTRACT

A user-configurable circuit architecture includes a two dimensional array of functional circuit modules disposed within a semiconductor substrate. A first interconnect layer disposed above and insulated from the semiconductor substrate contains a plurality of conductors and is used for internal connections within the functional circuit modules. A second interconnect layer disposed above and insulated from the first interconnect layer contains a plurality of segmented tracks of conductors running in a first direction and is used to interconnect functional circuit module inputs and outputs. A third interconnect layer disposed above and insulated from the second interconnect layer contains a plurality of segmented tracks of conductors running in a second direction, some of the segments of conductors forming intersections with ones of the segments of the conductors in the second interconnect layer, and is used to interconnect functional circuit module inputs and outputs to implement the desired applications. A plurality of user-configurable interconnect elements are placed directly between the second the third interconnect layers at the intersections of selected segments of the segmented conductors in the second and third interconnect layers. More user-configurable interconnect elements are located between adjacent segments of the segmented conductors in both the second and third interconnect layers. Pass transistors located in the semiconductor substrate in between the functional circuit modules are connected between adjacent segments in both the second and third interconnect layers and between selected intersecting segments in the second and third interconnect layers.

1 Claim, 3 Drawing Sheets

PROGRAMMABLE INTERCONNECT ARCHITECTURE HAVING INTERCONNECTS DISPOSED ABOVE FUNCTION MODULES

BACKGROUND OF THE INVENTION

1. Field of The Invention

The present invention relates to user-configurable integrated circuits. More specifically, the present invention relates to an architecture for user-configurable integrated circuits including an array of functional circuit modules overlayed by a plurality of interconnect layers between which are located a plurality of user-programmable interconnect elements.

2. The Prior Art

Presently-known user-configurable circuit architectures include a plurality of functional circuit modules disposed upon a semiconductor substrate. The functional modules are separated by spaces which contain one or more channels of conductors which serve as interconnect elements as well as a plurality of pass transistors which serve to temporarily connect together selected ones of the conductors for use during both testing and the programming of a plurality of user-programmable interconnect elements which are also disposed in the substrate between the functional circuit elements. Examples of prior art user-configurable circuit architectures which employ one or more of these features include the architectures disclosed in U.S. Pat. No. 4,758,745 and U.S. Pat. No. 4,642,487.

While architectures of the type disclosed in this prior art have proved to be useful, there remains room for improvement in speed and density of user-configurable circuit arrays.

BRIEF DESCRIPTION OF THE INVENTION

In a presently preferred embodiment, the architecture of the invention includes a two dimensional array of functional circuit modules disposed within a semiconductor substrate. A first interconnect layer disposed above and insulated from the semiconductor substrate contains a plurality of conductors and is used for internal connections within the functional circuit modules. A second interconnect layer disposed above and insulated from the first interconnect layer contains a plurality of segmented tracks of conductors running in a first direction and is used to interconnect functional circuit module inputs and outputs. A third interconnect layer disposed above and insulated from the second interconnect layer contains a plurality of segmented tracks of conductors running in a second direction, some of the segments of conductors forming intersections with ones of the segments of the conductors in the second interconnect layer, and is used to interconnect functional circuit module inputs and outputs to implement the desired applications.

A plurality of user-configurable interconnect elements are placed directly between the second and third interconnect layers at the intersections of selected segments of the segmented conductors in the second and third interconnect layers. More user-configurable interconnect elements are located between adjacent segments of the segmented conductors in both the second and third interconnect layers. Pass transistors located in the semiconductor substrate in between the functional circuit modules are connected between adjacent segments in both the second and third interconnect layers and between selected intersecting segments in the second and third interconnect layers.

The present invention enhances the functional density of previously disclosed programmable interconnect architectures by placing the segmented routing tracks directly on top of the arrays of functional circuit modules. The spacing between adjacent ones of the functional circuit modules in the array need not include the spacing for dedicated routing channels as in the prior art. Because the functional circuit modules in the array are spaced more closely together, shorter interconnect lengths may be used, thus improving the overall performance of the mapped applications.

DETAILED DESCRIPTION OF A PREFERRED EMBODIMENT

The present invention is an improvement in an architecture for a user-configurable interconnect architecture which results in a significant array size area reduction and increased speed because of the shorter interconnect conductor lengths and lower interconnect element capacitance resulting from locating the interconnect elements in a layer above the substrate.

Figure 1:
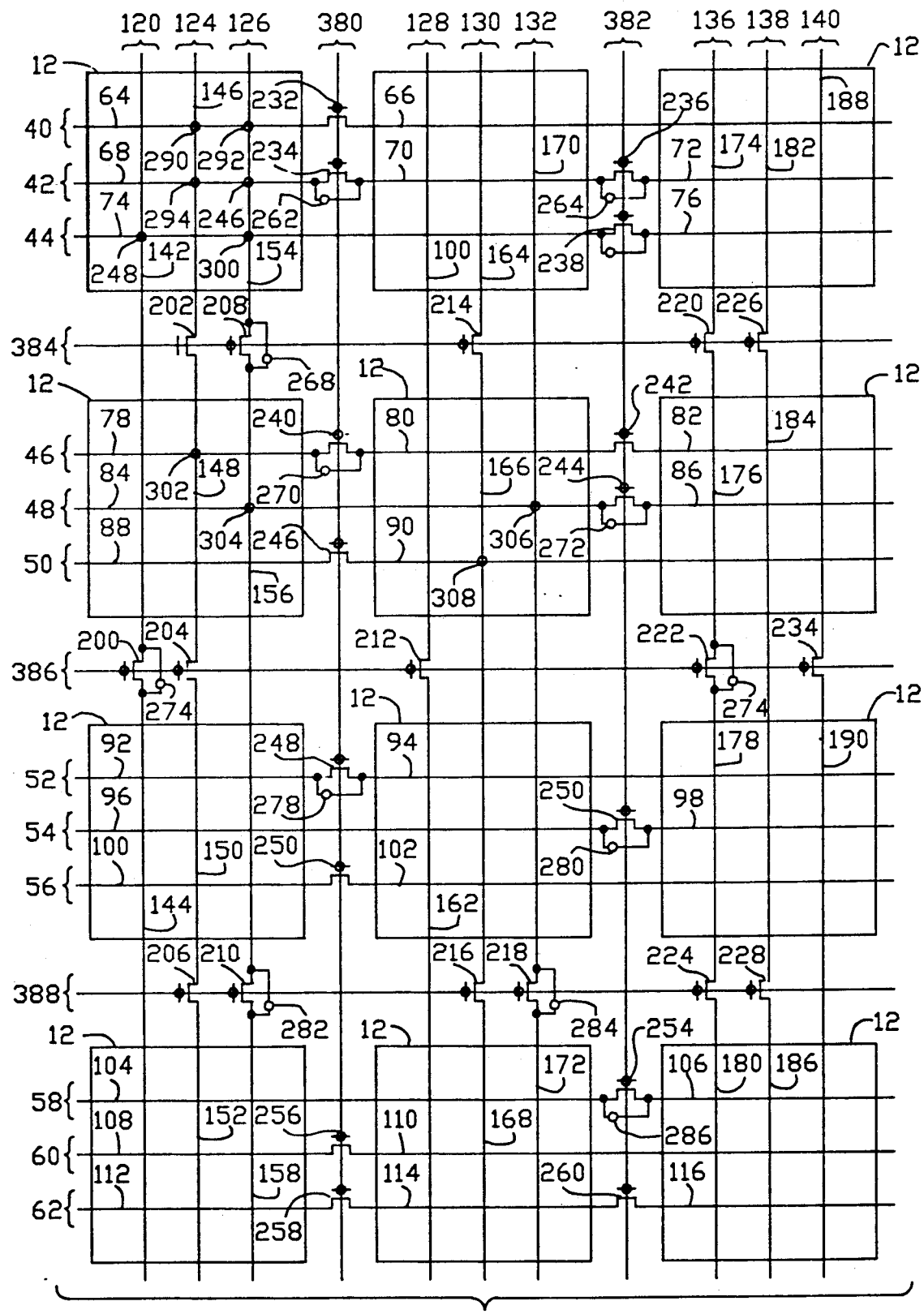
FIG. 1 is a simplified schematic diagram of an architecture according to a presently preferred embodiment of the invention showing a top view of a layout of functional circuit modules according to a presently preferred embodiment of the invention and further illustrating the features of two user-configurable interconnect layers according to a presently preferred embodiment of the invention.

Referring first to FIG. 1, an array architecture according to a preferred embodiment of the present invention may be fabricated on a semiconductor substrate 10 and includes a plurality of functional circuit modules 12. Although the array of FIG. 1 is arranged as a 3×4 matrix, those of ordinary skill in the art will recognize that this embodiment is merely illustrative and that the array size is arbitrary and dictated purely by design considerations.

The spacing between adjacent ones of the functional circuit modules need only be sufficient to accommodate the placement of a plurality of series pass transistors, shown schematically at reference numeral 14. The series pass transistors are used for temporarily connections while testing and programming the circuit.

Those of ordinary skill in the art will recognize that the rectangular boundary lines shown for the functional circuit modules 12 are somewhat arbitrary and that the actual area occupied by the functional circuit modules will be dictated by the diffusion area requirements of the elements of the functional circuit module. In this respect, the location of the series pass transistors in the areas "in between" the adjacent functional circuit modules should be understood by those of ordinary skill in the art as not excluding placement of these transistors, where possible, in available substrate space among the components of the functional circuit modules. In fact, in a presently preferred embodiment, the series-pass transistors associated with one of the interconnect layers may be located in and among the circuit elements of the functional circuit modules.

Figure 2:
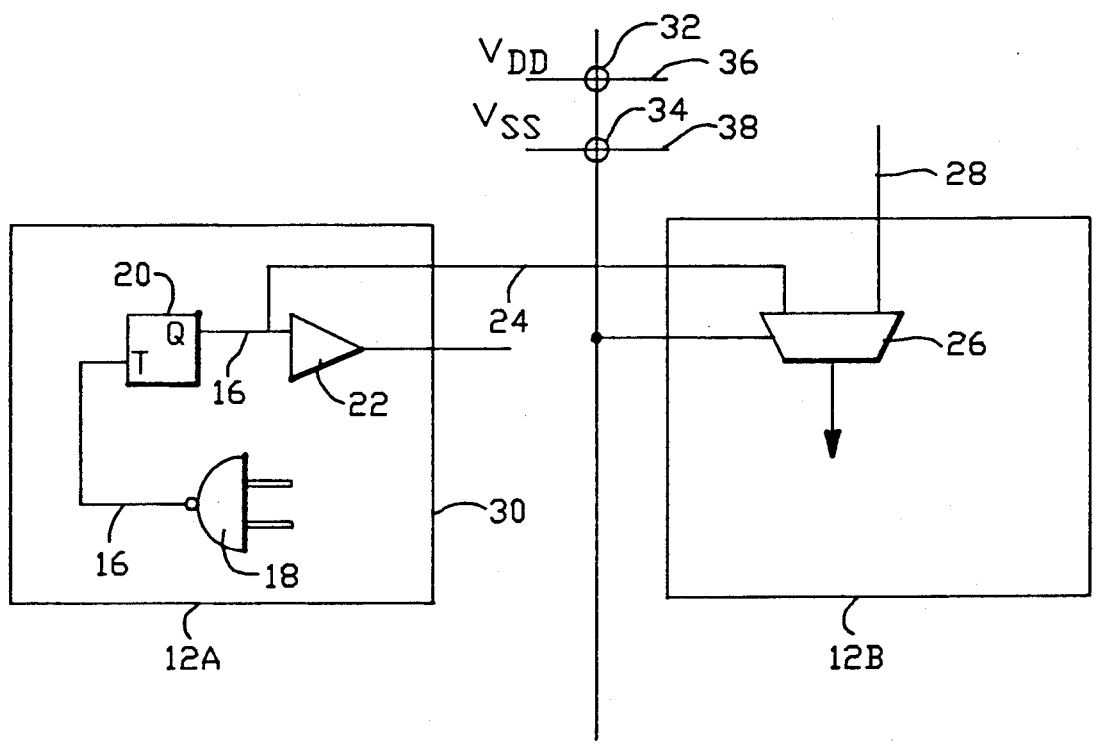
FIG. 2 is a simplified schematic diagram of an architecture according to a presently preferred embodiment of the invention showing a top view of a portion of the layout of functional circuit modules of FIG. 1 further including a portion of a dedicated interconnect layer according to a presently preferred embodiment of the invention.

Referring now to FIG. 2, showing a portion of the array of FIG. 1, a first interconnect layer is disposed above the surface of the substrate containing functional circuit modules 12a and 12b and includes a plurality of conductive members 16. Those of ordinary skill in the art will recognize that the first interconnect layer may be a conventional metallization layer or other interconnect layer formed and insulated from the surface of substrate 10 by conventional semiconductor processing techniques. In a presently preferred embodiment, individual ones of the conductors 16 in the first interconnect layer are used as fixed or dedicated interconnect elements to join together the circuit elements within single ones of the functional circuit modules by use of conventional deposition, etching, and contact formation techniques. The particular pattern of the first layer interconnect will depend entirely on the particular circuit with which it is used. In the example shown in FIG. 2, conductors 16 are used in functional circuit module 12a to join together two internal nodes of the module, i.e., the output of AND gate 18 to the toggle input of flip-flop 20, and the output of flip flop 20 to the input of output buffer 22.

Depending on the nature of the functional circuit modules used in a particular design, the first interconnect layer may also be used for certain interconnections between functional circuit modules. In the example shown in FIG. 2, the functional circuit modules include circuitry for performing logic functions, and interconnection may be made between a first functional circuit module 12a and a second functional circuit module 12b. Conductor 24 is thus used to connect a selected internal node from functional circuit module 12a to one input of an input multiplexer 26 in functional circuit module 12b. The other input to multiplexer 26 is one of the normal input lines 28 to the functional circuit module 12b. The control input of multiplexer 26 is connected to a conductor 30, disposed in an upper layer of interconnect conductors, which will be more fully described later. User-configurable elements 32 and 34 are connected between conductor 30 and conductors 36 and 38, located in an upper layer of interconnect conductors different from the layer containing conductor 30. Programming one of user-configurable elements 32 or 34 will select whether multiplexer 26 selects input 28 or the internal node at the output of flip-flop 20 in functional circuit module 12a from conductor 24. By providing the option to directly connect functional circuit modules 12a and 12b together in this manner, the delay inherent in output buffer 22 of functional circuit module 12a may be eliminated, and a shorter path, via conductor 24 may be used to make the connection, thus enabling the circuit configured from functional circuit modules 12a and 12b to function at a higher speed.

Referring again to FIG. 1, a second and a third interconnect layer, insulated from one another by known multilayer interconnect techniques, are disposed above and insulated from the first interconnect layer (not shown). These layers may contain a plurality of conductors. The second and third interconnect layers may be conventional metallization or other interconnect layers formed and insulated from the first interconnection layer and one another by conventional semiconductor processing techniques.

The second interconnect layer includes a plurality of conductive tracks, running in a first direction (shown as horizontal in FIG. 3), identified by reference numerals 40, 42, 44, 46, 48, 50, 52, 54, 56, 58, 60, and 62. As shown in FIG. 1, these tracks are divided into segments. The number, length, and distribution of the segments used are preferably as disclosed in co-pending application entitled "Segmented Routing Architecture", filed Jun. 22, 1990, assigned to the same assignee as the present invention, expressly incorporated herein by reference. FIG. 1 shows a schematic exemplary example of an assortment of segment lengths distributed among the conductors, although those of ordinary skill in the art will recognize that it is only exemplary and that other segment length distributions may be used. Thus track 40 includes segments 64 and 66; track 42 includes segments 68, 70 and 72; track 44 includes segments 74 and 76; track 46 includes segments 78, 80, and 82; track 48 includes segments 84 and 86; track 50 includes segments 88 and 90; track 52 includes segments 92 and 94; track 54 includes segments 96 and 98; track 56 includes segments 100 and 102; track 58 includes segments 104 and 106; track 60 includes segments 108, and 110; track 62 includes segments 112, 114, and 116.

The third interconnect layer also includes a plurality of conductive tracks, running in a second direction (shown as vertical in FIG. 3) identified by reference numerals 120, 124, 126, 128, 130, 132, 136, 138, and 140, which are also divided into segments. The number, length, and distribution of the segments used in the third interconnect layer are also preferably as disclosed in co-pending application entitled "Segmented Routing Architecture", filed Jun. 22, 1990. In the embodiment shown in FIG. 1, track 120 includes segments 142 and 144; track 124 includes segments 146, 148, 150 and 152; track 126 includes segments 154, 156, and 158; track 128 includes segments 160 and 162; track 130 includes segments 164, 166, and 168; track 132 includes segments 170 and 172; track 136 includes segments 174, 176, 178, and 180; track 138 includes segments 182, 184, and 186; track 140 includes segments 188 and 190.

The individual segments comprising the tracks in both the second and third interconnect layers are joined together at their ends by series-pass transistors located in the substrate. Segments 142 and 144 are shown joined by series-pass transistor 200. Segments 146 and 148 are shown joined by series-pass transistor 202. Segments 148 and 150 are shown joined by series-pass transistor 204. Segments 150 and 152 are shown joined by series-pass transistor 206. Segments 154 and 156 are shown joined by series-pass transistor 208. Segments 156 and 158 are shown joined by series-pass transistor 210. Segments 160 and 162 are shown joined by series-pass transistor 212. Segments 164 and 166 are shown joined by series-pass transistor 214. Segments 166 and 168 are shown joined by series-pass transistor 216. Segments 170 and 172 are shown joined by series-pass transistor 218. Segments 174 and 176 are shown joined by series-pass transistor 220. Segments 176 and 178 are shown joined by series-pass transistor 222. Segments 178 and 180 are shown joined by series-pass transistor 224. Segments 182 and 184 are shown joined by series-pass transistor 226. Segments 184 and 186 are shown joined by series-pass transistor 228. Segments 188 and 190 are shown joined by series-pass transistor 230. Segments 64 and 66 are shown joined by series-pass transistor 232. Segments 68 and 70 are shown joined by series-pass transistor 234. Segments 70 and 72 are shown joined by series-pass transistor 236. Segments 74 and 76 are shown joined by series-pass transistor 238. Segments 78 and 80 are shown joined by series-pass transistor 240. Segments 80 and 82 are shown joined by series-pass transistor 242. Segments 84 and 86 are shown joined by series-pass transistor 244. Segments 88 and 90 are shown joined by series-pass transistor 246. Segments 92 and 94 are shown joined by series-pass transistor 248. Segments 96 and 98 ar shown joined by series-pass transistor 250. Segments 100 and 102 are shown joined by series-pass transistor 252. Segments 104 and 106 are shown joined by series-pass transistor 254. Segments 108 and 110 are shown joined by series-pass transistor 256. Segments 112 and 114 are shown joined by series-pass transistor 258. Segments 114 and 116 are shown joined by series-pass transistor 260.

The segments which make up the horizontal and vertical tracks in the second and third interconnect layers are joined together by user-configurable interconnect elements. In a presently preferred embodiment, these user configurable interconnect elements may be antifuses such as those disclosed and claimed in co-pending application Ser. No. 508,306, filed Apr. 12, 1990, entitled "Improved Electrically programmable Antifuse Element", and assigned to the same assignee as the present invention, which application is expressly incorporated herein by reference. Those of ordinary skill in the art will recognize that other user-configurable elements which may be located in the insulating layer between the second and third interconnect layers may also be suitable for use in the present invention. The decision of whether to place such elements between all adjacent segments in a single track is a matter of design choice and largely depends on the particular application. In the embodiment illustrated in FIG. 1, user-configurable interconnect elements identified by reference numerals 262, 264, 266, 268, 270, 272, 274, 276, 278, 280, 282, 284, and 286 are shown shunting series pass transistors 234, 236, 238, 208, 240, 244, 200, 222, 248, 250, 210, 218, and 254, respectively.

In a presently preferred embodiment of the invention, user-configurable elements are also placed at intersections formed at the crossover points between segments in the second and third interconnect layer. Illustrative user-configurable interconnect elements identified by reference numerals 290, 292, 294, 296, 298, 300, 302, 304, 306, and 308 are shown connecting intersecting segment pairs 64-146, 64-154, 68-146, 68-154, 74-142, 74-154, 78-148, 84-156, 84-132, and 90-166, respectively. The number of intersecting segments provided with these user-configurable elements is also a matter of design choice and will depend largely on the particular application of the architecture.

Figure 3A:
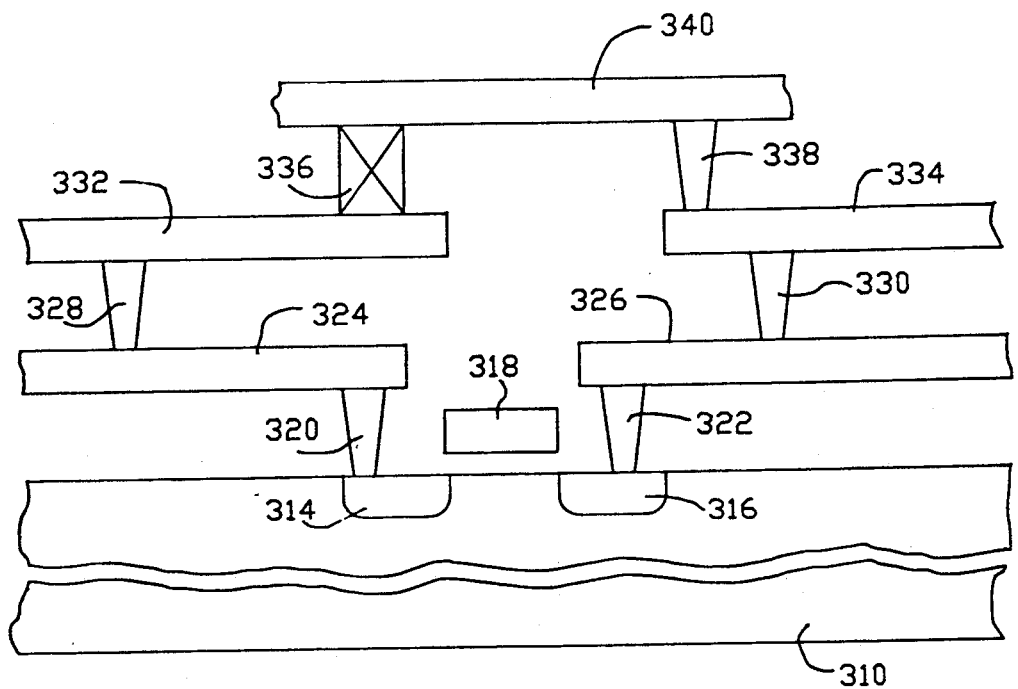
FIGS. 3a and 3b illustrate the interconnections between the first, second, and third interconnect layers, the series pass transistors and the user-configurable interconnect elements.

Connections are made between the various interconnect layers, the series pass transistors via conventional contact technology as is well known in the art. The various metal layers serve as electrodes of the user-configurable interconnect elements. Referring now to FIG. 3a, the placement of a user-configurable interconnect element along with an associated series pass transistor to connect together adjacent conductor segments in the second interconnect layer is shown. In semiconductor substrate 310, diffused areas 314 and 316, respectively, form the source and the drain of a series-pass transistor having a gate element 318. Contact 320 and 322 connect the source and drain regions 314 and 316 to first layer metal conductors 324 and 326. Contact 328 connects first layer metal segment 324 to second layer metal segment 332. Contact 330 connects first layer metal segment 326 with second layer metal segment 334. A user-configurable interconnect element 336 is used to connect together second layer metal segments 332 and 334 via a contact 338 and a conductor 340 in the third layer of metal. By use of this technique involving contacts and conductors in the different interconnect layers, user-configurable interconnect elements and series pass transistors may be interconnected with the conductors in the interconnect layers.

Figure 3B:
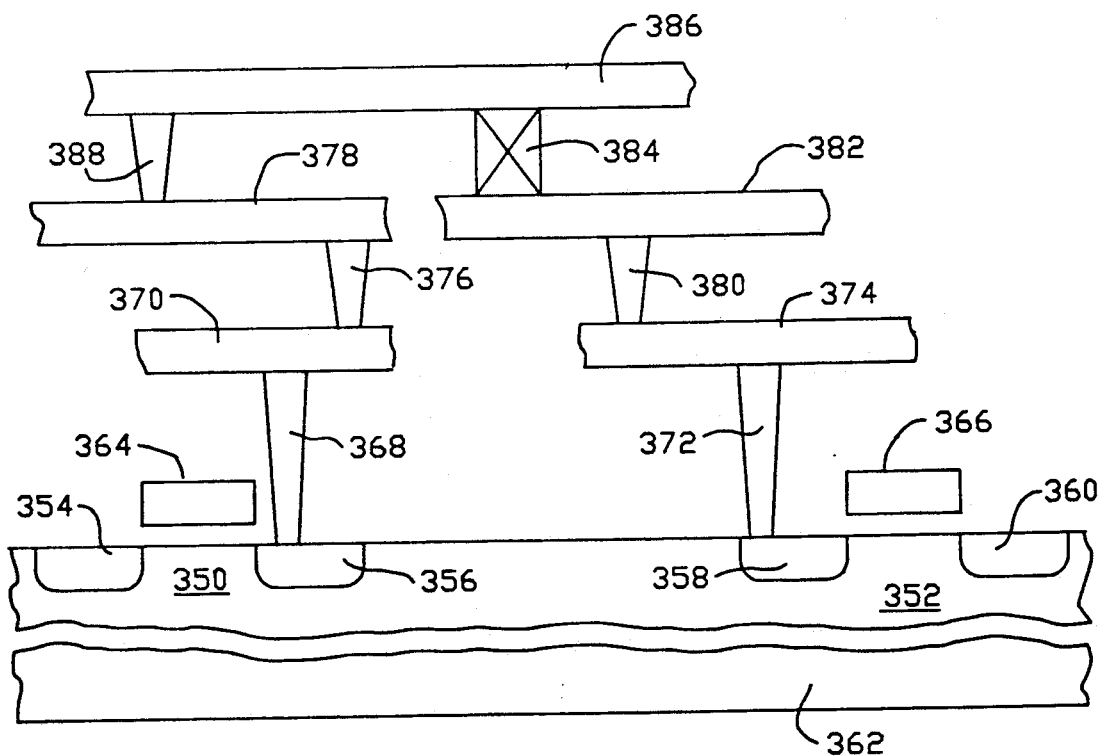

FIG. 3b illustrates the connection of a user-configurable interconnect element between intersecting conductors of the second and third interconnect layers. Two series-pass transistors 350 and 352 are formed from diffused source and drain regions 354, 356, 358, and 360, respectively in substrate 362. A gate 364 for transistor 350 is disposed above and between diffused regions 354 and 356. A gate 366 for transistor 352 is disposed above and between diffused regions 358 and 360. Contact 368 connects diffused region 356 to a first portion 370 of a first layer interconnect. Contact 372 connects diffused region 358 to a second portion 374 of the first layer interconnect. Contact 376 connects portion 370 of first layer interconnect to a first portion 378 of a second layer interconnect. Similarly, contact 380 connects second portion 374 of first interconnect to a second portion 382 of second layer interconnect. User configurable element 384 is disposed between second portion 382 of second layer interconnect and a first portion 386 of third layer interconnect which intersects second portion 382 of second layer interconnect. Contact 388 connects first portion 386 of third layer interconnect to series pass transistor 350 through the already recited portions 370 and 378 of fist and second layer interconnect conductor 368 through contacts 368 and 376. Diffusion regions 354 and 360, shown uncommitted in FIG. 3b, will be understood by those of ordinary skill in the art to be connected to circuit nodes which will supply programming voltages to be used for programming interconnect element 384.

Referring again to FIG. 1, the gates of all of the series pass transistors which line up by row or column are commonly connected to a gate drive line. Thus, gate line 380 controls the gates of series pass transistors 232, 234, 240, 246, 248, 252, 256, and 258; gate line 382 controls the gates of series pass transistors 236, 238, 242, 244, 250, 254, and 260; gate line 384 controls the gates of series pass transistors 202, 208, 214, 220, and 226; gate line 386 controls the gates of series pass transistors 200, 204, 212, 222, and 230; and gate line 388 controls the gates of series pass transistors 206, 210, 216, 218, 224, and 228. Circuitry for controlling the operation of the series-pass transistors is preferably located outside the periphery of the array of function circuits and is disclosed in U.S. Pat. No. 4,758,745, assigned to the same assignee as the present invention and expressly incorporated herein by reference. This patent also discloses the methods used for programming of the user-configurable circuit elements of the present invention.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is

1. A user-configurable circuit array architecture, including:
- a two dimensional array of functional circuit modules disposed within a semiconductor substrate,
- a first interconnect layer disposed above and insulated from the semiconductor substrate, said first interconnect layer including a plurality of conductors,
- a second interconnect layer disposed above and insulated from said first interconnect layer, said second interconnect layer including a plurality of segmented tracks of conductors running in a first direction,
- a third interconnect layer disposed above and insulated from the second interconnect layer, said second interconnect layer including a plurality of segmented tracks of conductors running in a second direction, some of the segments of conductors forming intersections with ones of the segments of the conductors in said second interconnect layer,
- a plurality of user-configurable interconnect elements are placed directly between the second and third interconnect layers at the intersections of selected segments of the segmented conductors in the second and third interconnect layers,
- plurality of user-configurable interconnect elements are located between adjacent segments of the segmented conductors in both said second and third interconnect layers,
- series pass transistors located in said semiconductor substrate in between the functional circuit modules, said series pass transistors connected between adjacent segments in both said second and third interconnect layers.

* * * * *

UNITED STATES PATENT AND TRADEMARK OFFICE
CERTIFICATE OF CORRECTION

PATENT NO. : 5,132,571
DATED : July 21, 1992
INVENTOR(S) : John L. McCollum, Abbas A. El Gamal, Jonathan W. Greene It is certified that error appears in the above-indentified patent and that said Letters Patent is hereby corrected as shown below:

<u>In the claims</u>:

Column 7, lines 18-19: replace "second" with --third--.

Signed and Sealed this

Thirteenth Day of May, 1997

Attest:

BRUCE LEHMAN

Attesting Officer

Commissioner of Patents and Trademarks